(12) United States Patent
Schricker et al.

(10) Patent No.: US 10,270,013 B2
(45) Date of Patent: Apr. 23, 2019

(54) WAVELENGTH CONVERTED SEMICONDUCTOR LIGHT EMITTING DEVICE

(71) Applicant: LUMILEDS LLC., San Jose, CA (US)

(72) Inventors: April Dawn Schricker, San Jose, CA (US); Oleg Borisovich Shchekin, San Jose, CA (US); Han Ho Choi, San Jose, CA (US); Peter Josef Schmidt, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/679,897

(22) Filed: Aug. 17, 2017

(65) Prior Publication Data

US 2018/0033923 A1    Feb. 1, 2018

Related U.S. Application Data

(62) Division of application No. 14/903,727, filed as application No. PCT/IB2014/062813 on Jul. 3, 2014, now Pat. No. 9,761,768.

(Continued)

(51) Int. Cl.
*H01L 27/15* (2006.01)
*H01L 33/50* (2010.01)
(Continued)

(52) U.S. Cl.
CPC .......... *H01L 33/504* (2013.01); *H01L 27/156* (2013.01); *H01L 33/501* (2013.01);
(Continued)

(58) Field of Classification Search
CPC ..................................................... H01L 33/504
See application file for complete search history.

(56) References Cited

U.S. PATENT DOCUMENTS

| 7,180,240 B2 * | 2/2007 | Noguchi | H01L 33/486 257/100 |
| 7,361,938 B2 * | 4/2008 | Mueller | C04B 35/44 257/79 |

(Continued)

FOREIGN PATENT DOCUMENTS

| CN | 101931040 A | 12/2010 | |
| JP | 2010287777 A * | 12/2010 | F21S 41/143 |

(Continued)

OTHER PUBLICATIONS

Partial translation of already cited document JP 2011116974 in the IDS filed Apr. 10, 2018.*

(Continued)

*Primary Examiner* — Eugene Lee

(57) ABSTRACT

In embodiments of the invention, a light emitting device includes a semiconductor structure including a light emitting layer disposed between an n-type region and a p-type region. A first wavelength converting layer is disposed in a path of light emitted by the light emitting layer. The first wavelength converting layer may be a wavelength converting ceramic. A second wavelength converting layer is fused to the first wavelength converting layer. The second wavelength converting layer may be a wavelength converting material disposed in glass.

11 Claims, 2 Drawing Sheets

Related U.S. Application Data

(60) Provisional application No. 61/843,466, filed on Jul. 8, 2013.

(51) Int. Cl.
*H01L 33/60* (2010.01)
*H01L 25/075* (2006.01)

(52) U.S. Cl.
CPC ........ *H01L 33/505* (2013.01); *H01L 25/0753* (2013.01); *H01L 33/60* (2013.01); *H01L 2224/16225* (2013.01); *H01L 2224/32225* (2013.01); *H01L 2224/73204* (2013.01); *H01L 2933/0041* (2013.01); *H01L 2933/0058* (2013.01)

(56) References Cited

U.S. PATENT DOCUMENTS

| | | | |
|---|---|---|---|
| 7,521,862 B2 | 4/2009 | Mueller et al. | |
| 7,902,566 B2 * | 3/2011 | Paolini | H01L 33/508 257/88 |
| 8,114,692 B2 | 2/2012 | Krames | |
| 8,169,136 B2 * | 5/2012 | Nakamura | B82Y 30/00 257/79 |
| 8,251,538 B2 * | 8/2012 | Samber | H01L 33/60 313/503 |
| 8,324,647 B2 | 12/2012 | McKenzie et al. | |
| 8,410,500 B2 | 4/2013 | Sormani et al. | |
| 8,410,681 B2 | 4/2013 | Shaikevitch et al. | |
| 8,481,977 B2 * | 7/2013 | Beeson | H01L 33/501 250/486.1 |
| 8,500,315 B2 | 8/2013 | Tokida et al. | |
| 8,704,262 B2 * | 4/2014 | Livesay | H01L 33/642 257/98 |
| 8,754,435 B1 | 6/2014 | Tischler et al. | |
| 8,846,172 B2 * | 9/2014 | Nakamura | B32B 18/00 428/43 |
| 8,846,423 B2 * | 9/2014 | Camras | H01L 33/58 257/666 |
| 8,921,882 B2 | 12/2014 | Suenaga | |
| 8,941,135 B2 * | 1/2015 | Fujii | H01L 33/507 257/98 |
| 8,957,428 B2 | 2/2015 | Jagt et al. | |
| 9,046,227 B2 * | 6/2015 | David | F21V 13/08 |
| 9,202,995 B2 | 12/2015 | Kuretake | |
| 9,293,671 B2 | 3/2016 | Brunner et al. | |
| 2004/0245530 A1 * | 12/2004 | Kameyama | H01L 27/14618 257/80 |
| 2005/0274967 A1 * | 12/2005 | Martin | C03C 3/12 257/98 |
| 2007/0278935 A1 * | 12/2007 | Harada | C09K 11/0883 313/503 |
| 2009/0039375 A1 | 2/2009 | LeToquin et al. | |
| 2009/0057690 A1 | 3/2009 | Chakraborty | |
| 2010/0019260 A1 | 1/2010 | Epler et al. | |
| 2010/0123386 A1 | 5/2010 | Chen | |
| 2010/0142189 A1 | 6/2010 | Hong et al. | |
| 2011/0049550 A1 | 3/2011 | Katsuno et al. | |
| 2011/0227477 A1 | 9/2011 | Zhang et al. | |
| 2011/0273079 A1 | 11/2011 | Pickard et al. | |
| 2011/0273864 A1 | 11/2011 | Izawa et al. | |
| 2011/0316025 A1 | 12/2011 | Kuzuhara et al. | |
| 2012/0043559 A1 | 2/2012 | Hiramatsu | |
| 2013/0207151 A1 | 8/2013 | Eberhardt et al. | |
| 2014/0021503 A1 | 1/2014 | Yoshida et al. | |
| 2014/0361328 A1 | 12/2014 | Shimamura et al. | |
| 2016/0240735 A1 * | 8/2016 | Moran | H01L 33/20 |

FOREIGN PATENT DOCUMENTS

| | | | |
|---|---|---|---|
| JP | 2011-116974 A | | 6/2011 |
| JP | 2011529267 A | * | 12/2011 |
| WO | 2012/132232 | | 10/2012 |

OTHER PUBLICATIONS

EPO as ISA, PCT/IB2014/062813, filed Jul. 3, 2014, International Search Report and Written Opinion, dated Oct. 13, 2014, 8 pages.

* cited by examiner

WAVELENGTH CONVERTED SEMICONDUCTOR LIGHT EMITTING DEVICE

CROSS REFERENCE TO RELATED APPLICATIONS

This application is a divisional of U.S. Non-Provisional application Ser. No. 14/903,727 filed Jan. 16, 2016, which is the U.S. National Stage, under 35 U.S.C. § 371, of International Application No. PCT/IB2014/062813 filed Jul. 3, 2014 and which claims the benefit of U.S. Provisional Patent Application No. 61/843,466 filed on Jul. 8, 2013, which are hereby incorporated by reference herein.

FIELD OF THE INVENTION

The present invention relates to a wavelength converted semiconductor light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a lighting apparatus described in more detail in US patent application 2011/0227477. The device of FIG. 1 includes a submount 100 with a light source (e.g., an LED) mounted thereon. Paragraph 54 of US patent application 2011/0227477 teaches "First emissive layer 110 is disposed above the second emissive layer 115 and receives at least a portion of the radiation emitted from the light source 105. Second emissive layer 115 is disposed between the conventional base LED 105 and the first emissive layer 110. The second emissive layer 115 receives at least a portion of the radiation emitted from the light source 105. An optional encapsulant resin 120 is placed over the light source 105, the first emissive layer 110 and the second emissive layer 115. In some embodiments, the first emissive layer 110 and the second emissive layer 115 are fixed together to form a composite."

Paragraph 60 of US patent application 2011/0227477 teaches "The lighting apparatus can include a first emissive layer having a first garnet phosphor and a second emissive layer having a second garnet phosphor . . . . The emissive layers may, in some embodiments, be ceramic plates . . . . The ceramic plates may be fixed together to form a composite."

SUMMARY

It is an object of the invention to provide a wavelength converted semiconductor light emitting device suitable for applications that may require high drive current and/or high operating temperatures.

In embodiments of the invention, a light emitting device includes a semiconductor structure including a light emitting layer disposed between an n-type region and a p-type region. A first wavelength converting layer is disposed in a path of light emitted by the light emitting layer. The first wavelength converting layer may be a wavelength converting ceramic. A second wavelength converting layer is fused to the first wavelength converting layer. The second wavelength converting layer may be a wavelength converting material disposed in glass.

A method according to embodiments of the invention includes forming a wavelength converting element. Forming a wavelength converting element includes forming a first wavelength converting layer, which may be a wavelength converting ceramic, and fusing a second wavelength converting layer to the first wavelength converting layer. The wavelength converting element is diced into a plurality of platelets. After dicing, one or more platelets are attached to a single semiconductor light emitting device.

DETAILED DESCRIPTION

Embodiments of the invention are directed to wavelength converted semiconductor light emitting devices with more than one wavelength converting material. Embodiments of the invention may be used in applications that may require high drive current and/or high operating temperatures, such as, for example, automotive head lamps.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
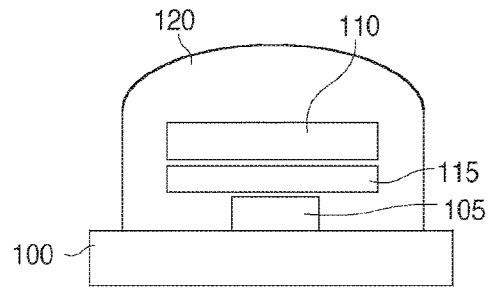
FIG. 1 illustrates a lighting apparatus including an LED and two ceramic phosphor plates.
Figure 2:
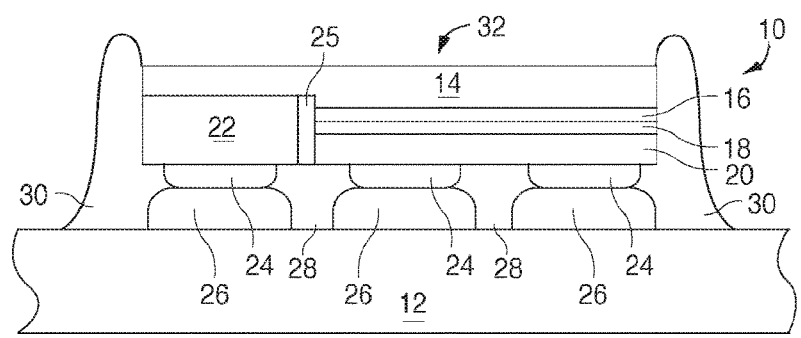
FIG. 2 illustrates a semiconductor light emitting device.

FIG. 2 illustrates a III-nitride LED that may be used in embodiments of the present invention. Any suitable semiconductor light emitting device may be used and embodiments of the invention are not limited to the device illustrated in FIG. 2.

The device of FIG. 2 is formed by growing a III-nitride semiconductor structure on a growing substrate as is known in the art. The growth substrate (not shown in FIG. 2) may be any suitable substrate such as, for example, sapphire, SiC, Si, GaN, or a composite substrate. The semiconductor structure includes a light emitting or active region sandwiched between n- and p-type regions. An n-type region 14 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 16 is grown over then-type region. Examples of suitable light emitting regions include a single thick or thin light emitting layer, or a multiple quantum well light emitting region including multiple thin or thick light emitting layers separated by barrier layers. A p-type region 18 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 20 often includes multiple conductive layers such as a reflective metal and a guard metal which may prevent or reduce electromigration of the reflective metal. The reflective metal is often silver but any suitable material may be used. After forming the p-contact 20, a portion of the p-contact 20, the p-type region 18, and the active region 16 is removed to expose a portion of then-type region 14 on which an n-contact 22 is formed. The n- and p-contacts 22 and 20 are electrically isolated from each other by a gap 25 which may be filled with a dielectric such as an oxide of silicon or any other suitable material. Multiple n-contact vias may be formed; the n- and p-contacts 22 and 20 are not limited to the arrangement illustrated in FIG. 2. The n-contacts and p-contacts may be redistributed to form bond pads with a dielectric/metal stack, as is known in the art.

In order to attach the LED to a mount 12, one or more interconnects 24 are formed on or electrically connected to then- and p-contacts 22 and 20. Interconnects 24 electrically and physically connect the LED to mount 12. Interconnects 24 may be, for example, gold stud bumps, old layers, or any other suitable structure. Gold stud bumps may be, for example, between 60 µm and 100 µm in diameter. Individual LEDs are diced from a wafer of devices, for example after forming interconnects 24.

Interconnects 26 may be formed on mount 12. Mount 12 may be any suitable material including, for example, metal, ceramic, or silicon. Interconnects 26 on mount 12 align with interconnects 24 on the LED. Either of interconnects 24 or 26 may be omitted such that interconnects are formed on only one of the LED and the mount, not on both the LED and the mount. Vias may be formed within the mount or traces formed on the surface of the mount to electrically connect the top side of the mount, on which the LED is mounted, to the bottom side of the mount, which may be attached to another structure.

An individual LED is flipped over relative to the growth direction of the semiconductor structure and attached to mount 12. The LED may be attached to the mount by, for example, ultrasonic bonding, thermosonic bonding, solder attach, or any other suitable bonding technique.

Before or after bonding to mount 12, an underfill material 30 is disposed between the LED and the mount 12. Underfill 30 supports the semiconductor structure during later processing. Underfill 30 may fill gaps 28 between neighboring interconnects 24. Underfill 30 may be introduced between the LED and mount 12 by injection or any other suitable method. Underfill 30 may be, for example, silicone, epoxy, or any other suitable material. Underfill 30 may be injected in a liquid form then cured to form a solid. Excess underfill material may be removed by any suitable technique such as microbead blasting.

The growth substrate may be removed by any suitable technique. A sapphire substrate is often removed by laser melting, where laser light is shined through the substrate and melts the layer of semiconductor material in direct contact with the substrate, releasing the substrate from the semiconductor structure. Other substrates may be removed by, for example, etching or mechanical techniques such as grinding. Removing the substrate exposes the surface 32 of n-type region 14. Surface 32 may be patterned, textured, or roughened, for example by photoelectrochemical etching or any other suitable technique, which may increase light extraction from surface 32.

FIG. 2 illustrates an LED supported by an underfill and thick metal interconnects, from which the growth substrate has been removed. Any other suitable LEDs may be used. In some embodiments, an LED where the growth substrate remains attached to the semiconductor structure is used. For example, an LED semiconductor structure may be grown on a sapphire substrate that remains attached to the semiconductor structure. The sapphire may be thinned after growth, for example to a thickness less than 100 11 m thick, though it need not be. Because the sapphire mechanically supports the semiconductor structure, underfill is not required for mechanical support, though underfill may be included. Thick metal interconnects are not required, though they may be included. The LED may be attached to a mount by any suitable technique such as soldering.

Figure 3:
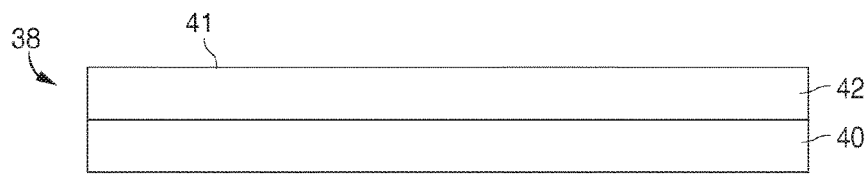
FIG. 3 is a cross sectional view of a portion of a wavelength converting wafer.
Figure 4:
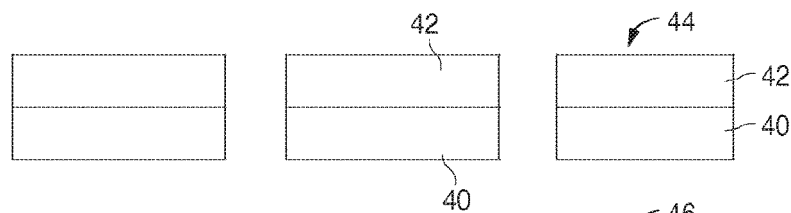
FIG. 4 illustrates the structure of FIG. 3 diced into individual platelets.
Figure 5:
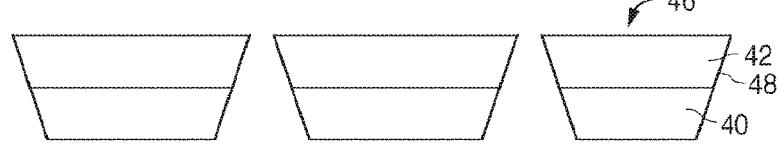
FIG. 5 illustrates the structure of FIG. 3 diced into individual platelets with shaped sides.

Separate from the LED, a wavelength converting member is formed as illustrated in FIGS. 3, 4, and 5. The wavelength converting member absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

In FIG. 3, a wavelength converter 38 with two wavelength converting layers 40 and 42 is formed. Wavelength converting layers 40 and 42 typically include different wavelength converting materials, though they need not. Wavelength converting layers 40 and 42 often emit different colors of light, though they need not. Wavelength converting layers 40 and 42 may be any material that can withstand high temperature and high current operating conditions. For example, wavelength converting layers 40 and 42 may be designed to withstand the operating conditions associated with currents up to 2.5 A and operating temperatures up to 240° C.

In some embodiments, wavelength converting layer 40 is a luminescent ceramic such as a powder phosphor sintered into a ceramic layer. In some embodiments, wavelength converting layer 42 is a glass or other suitable transparent material loaded with one or more wavelength converting materials such as conventional phosphors, organic phosphors, quantum dots, organic semiconductors, II-VI or III-V semiconductors, II-VI or III-V semiconductor quantum dots or nanocrystals, dyes, polymers, or other materials that luminesce.

In one example, wavelength converting layer 40 is a ceramic phosphor that absorbs blue light and emits red light. Suitable ceramic phosphors that emit red light include but are not limited to $(Ba_{1-x-y-z}Sr_xCa_yEu_z)_2Si_{5-a-b}Al_a N_{8-a-4b}O_{a+4b}$ with $0.5 \leq x \leq 0.9$, $0 \leq y \leq 0.1$, $0.003 \leq z \leq 0.03$, $0 \leq a \leq 0.05$ and $0 \leq b \leq 0.2$, $(Ca_{1-x-y-z-v}M^{II}_vSi_{1+x-z}Al_{1-x+z} N_{3-x}O_x:Eu_y,Ce_z; M^{II}=Sr, Ba, Mg$ with $0 \leq x \leq 0.05$, $0 \leq y \leq 0.01$, $0 < z \leq 0.04$, $0 \leq v \leq 0.85$. Wavelength converting layer 40 may be at least 5 µm thick in some embodiments, no more than 400 µm thick in some embodiments, at least 20 µm thick in some embodiments, and no more than 200 µm thick in some embodiments.

In one example, wavelength converting layer 42 is a phosphor disposed in glass. The phosphor in wavelength converting layer 42 absorbs blue light and emits green light. Suitable phosphors that emit green light include but are not limited to $(Lu_{1-x-y}Y_xCe_y)_3Al_5O_{12}$ with $0 \leq x \leq 1$, $0.0015 \leq y \leq 0.04$, or $Sr_{1-x-y}M^{II}_xEu_ySi_2O_2N_2$; $M=Ca, Ba$ with $0 \leq x \leq 0.5$, $0.002 \leq y \leq 0.04$. Wavelength converting layer 42 may be at least 5 µm thick in some embodiments, no more than 400 µm thick in some embodiments, at least 20 µm thick in some embodiments, and no more than 200 µm thick in some embodiments. Any combination of thicknesses of wavelength converting layers 40 and 42 may be used which meets the color point requirements of a given application.

The structure illustrated in FIG. 3 may be formed by first forming the ceramic wavelength converting layer 40, for example by pressing and sintering a powder phosphor or by any other suitable process. In some embodiments, wavelength converting layer 40 is thinned after sintering, for example by a mechanical process such as grinding or by any other suitable technique. Wavelength converting layer 40 may be thinned for example from at least 800 µm thick to no more than 300 µm thick. After thinning, wavelength converting layer 40 is mated with wavelength converting layer 42. Each of wavelength converting layer 40 and wavelength converting layer 42 may be thinned before or after mating, as described herein. These thinning processes are optional and are not illustrated in the figures.

Wavelength converting layer 42 may be formed by, for example, mixing a selected green phosphor with molten glass to a predetermined phosphor loading. The mixture may be rolled into sheets, cut to fit onto a disc of wavelength converting layer 40, then fused to wavelength converting layer 40, for example by heating to a temperature greater than the reflow temperature of the glass. Alternatively, the mixture of glass and phosphor may be deposited directly onto wavelength converting layer 40 while hot (for example, while above the reflow temperature) then spread out evenly to form a glass layer of substantially uniform thickness. In some embodiments the reflow temperature may be as low as 320° C. or as high as 1500° C. depending on the glass material. The phosphors used may tolerate temperatures of 1700° C. in some embodiments and of 1800° C. in some embodiments. Any suitable glass or other transparent material may be used. The glass may be a low refractive index glass, for example having an index of refraction less than 1.7 in some embodiments, less than 1.6 in some embodiments, and 1.52 in some embodiments, to improve extraction. The phosphor material, loading amount, and final thickness post-thinning (described below) for wavelength converting layer 42 are selected to match the blue light emitted from the light emitting device such that the light exiting the combined structure of the light emitting device and the wavelength converter meets the targeted specifications for color point and lumens for a given application.

In some embodiments, the surface of wavelength converting layer 40 that is mated with wavelength converting layer 42 is roughened, patterned, or textured, which may increase the surface area of the layer and thereby improve the strength of the bond between wavelength converting layer 42 and wavelength converting layer 40. Roughening, patterning, or texturing the interface between wavelength converting layer 42 and wavelength converting layer 40 may also improve light extraction from wavelength converting layer 40 into wavelength converting layer 42, and may reduce or prevent reflection of light from wavelength converting layer 42 into wavelength converting layer 40.

In some embodiments, a fusing agent or pre-treatment is applied to one or both of wavelength converting layer 40 and wavelength converting layer 42, to improve bonding between the two materials. For example, one or both of a silicon nitride barrier layer and a silicon oxide layer may be disposed on a ceramic wavelength converting layer 40, to improve the interface between ceramic wavelength converting layer 40 and glass wavelength converting layer 42, and/or to prevent ceramic oxidation during heating. The silicon nitride and/or silicon oxide layers may be formed on wavelength converting layer 40 by any suitable technique, including for example, megatron sputtering, chemical vapor deposition, plasma enhanced chemical vapor deposition, and evaporation.

In some embodiments, to fully fuse a glass wavelength converting layer 42 with a ceramic wavelength converting layer 40, the combined structure 38 must be heated to a temperature greater than the reflow temperature of the glass in wavelength converting layer 42 under inert environment. In some embodiments the reflow temperature may be as low as 320° C. or as high as 1500° C. depending on the glass material. After heating to above the reflow temperature during fusing, the glass wavelength converting layer 42 may not be flat or of sufficiently uniform thickness. In some embodiments, to improve the center-to-edge thickness uniformity of wavelength converting structure 38 and/or to meet the color point of a given application, the glass wavelength converting layer 42 may be thinned after being fused to wavelength converting layer 40, for example by grinding the top surface 41 of the wafer illustrated in FIG. 3, or by any other suitable technique.

In some embodiments, both the glass wavelength converting layer 42 and the ceramic wavelength converting layer 40 may be thinned after fusing, for example by grinding or any other suitable technique. In some embodiments, only the ceramic wavelength converting layer 40 may be thinned after fusing. In some embodiments, the ceramic wavelength converting layer 40 is thinned after fusing from at least 300 µm to no more than 120 µm. Ceramic wavelength converting layer 40 may be thinned before fusing (for example, from a thickness of 800 µm to a thickness of 300 µm, as described above) by a coarse grinding technique, then thinned after fusing (for example from a thickness of 300 µm to no more than 120 µm, as described above) using a more refined grinding/polishing technique.

Thinning generally occurs while the wavelength converting structure 38 is still in wafer form, before the structure of FIG. 3 is diced into individual platelets, as described below. A ceramic wavelength converting layer 40 typically transfers heat more readily than a glass wavelength converting layer 42. Accordingly, in some embodiments, the structure 38 is oriented such that wavelength converting layer 40 is disposed adjacent to the light emitting device and wavelength converting layer 42 is the top layer from which light is extracted. In some embodiments, the top surface of wavelength converting layer 42 is roughened, patterned, or textured during thinning to improve light extraction from structure 38 and to reduce or prevent back reflection.

Figure 9:
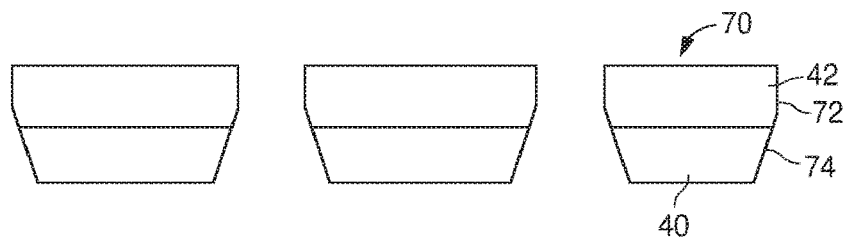
FIG. 9 illustrates the structure of FIG. 3 diced into individual platelets with shaped sides.

The wavelength converter 38 is diced into platelets that are sized for a single light emitting device or a tile of multiple light emitting devices. FIGS. 4, 5, and 9 illustrate diced wavelength converting platelets.

In FIG. 4, the platelets 44 are diced with a saw blade oriented perpendicular to the wafer surface. The platelets 44 in FIG. 4 have substantially vertical sides. The platelets may be the same shape and size as the light emitting device, slightly larger than the light emitting device (for example a platelet 1.06×1.06 mm² may be disposed on an LED die 1×1 mm²), or slightly smaller than the light emitting device (for example a platelet 0.965×0.965 mm² may be disposed on an LED 1×1 mm²).

In FIG. 5, the platelets 46 have angled sides 48. The angle of the sidewall is consistent through the entire thickness of the platelet 46. Platelets 46 may be formed by cutting the platelets from the wafer 38 using an angled saw blade. For example, the saw blade may be angled at an angle of no more than 80° relative to a normal to the top surface of the wafer in some embodiments, at least 30° relative to a normal to the top surface of the wafer in some embodiments, no more than 65° relative to a normal to the top surface of the wafer in some embodiments, and at least 45° relative to a normal to the top surface of the wafer in some embodiments.

In FIG. 9, the platelets 70 have side walls with more than one surface. The sidewalls have a first surface 72 with a first orientation and a second surface 74 with a second orientation that is different from the first orientation. In the structure of FIG. 9, the first section 72 is substantially vertical and the second section 74 is angled. In other examples, the first section may be angled relative to a normal to the top surface of the wafer and the second section may be angled at a different angle than the first section. The interface between the first and second sections may be within wavelength converting layer 40, within wavelength converting layer 42 as illustrated in FIG. 9, or at the interface between wavelength converting layers 40 and 42. The structure illustrated in FIG. 9 is formed by sawing the wavelength converting wafer 38 shown in FIG. 3 in two passes. In one embodiment an angled blade cuts the angled portion 74. Next the wafer is cut with a straight blade that forms vertical section 72. In one embodiment the second cut fully separates the platelets 70 from each other. Either surface may be formed first. When platelets 46 have angled sides as in FIGS. 5 and 9, the thickness of the angled region in combination with the angle of the sidewall determines the area of the bottom surface of the platelet, i.e. the surface disposed next to the LED die. For example, for an LED die that is 1×1 mm², if the top surface of the platelet is 1.06×1.06 mm², possible bottom dimensions for the platelet include 0.98×0.98 mm², 0.965×0.965 mm², 0.94×0.94 mm² and other dimensions which are equal to or smaller than the 1×1 mm² LED die. The bottom surface of the platelet is often the same size as the LED die or smaller, though it need not be.

Figure 6:
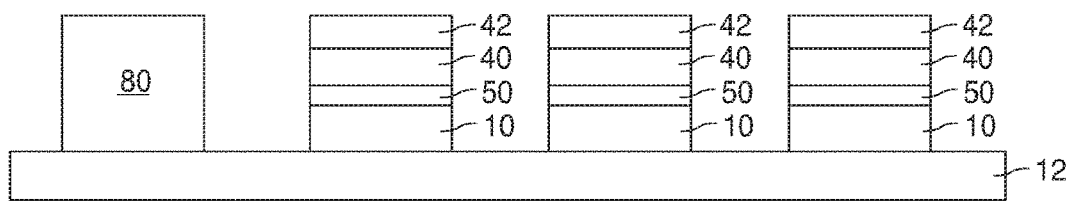
FIG. 6 illustrates the platelets illustrated in FIG. 4 attached to individual LEDs.
Figure 7:
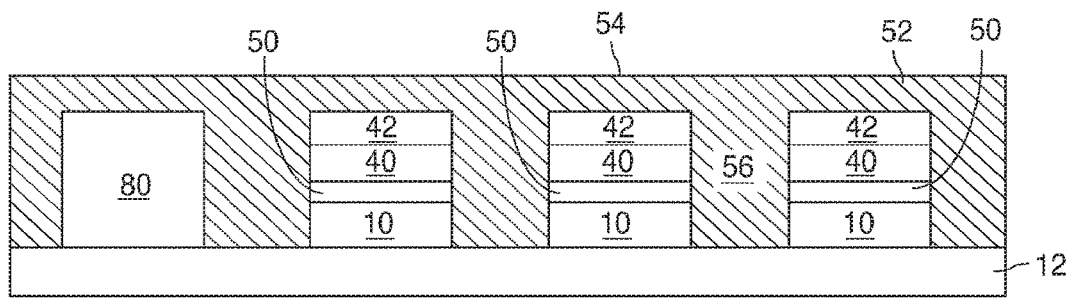
FIG. 7 illustrates the structure of FIG. 6 after forming a reflective material layer.
Figure 8:
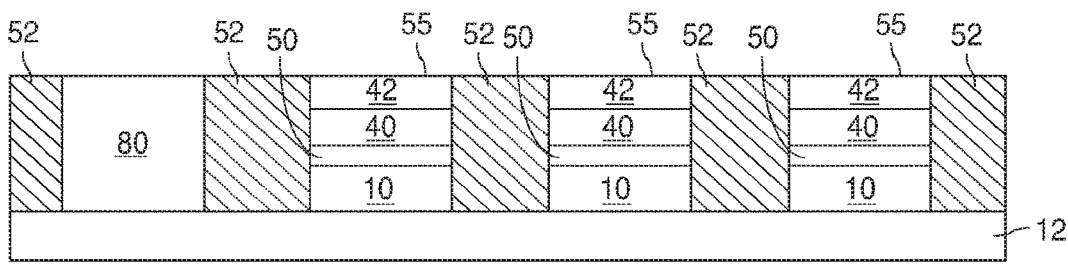
FIG. 8 illustrates the structure of FIG. 7 after etching back the reflective material layer to reveal the tops of the wavelength converting platelets.

FIGS. 6-8 illustrate assembling the wavelength converting light emitting device. In FIG. 6, individual LEDs 10, which may be the devices illustrated in FIG. 2 or any other suitable device, are attached to a mount 12. Individual wavelength converting platelets, such as one of the structures illustrated in FIG. 4, 5, or 9, are pick-and-place attached to each LED 10. In some embodiments, a layer of adhesive 50 is cast, dispensed, jetted, or otherwise disposed onto the LED 10 prior to attaching the wavelength converting platelet to the LED. Any suitable adhesive, such as silicone, may be used. In FIGS. 6-8, the wavelength converting platelets are mounted such that the ceramic wavelength converting layer 40 is attached to LED 10 and glass wavelength converting layer 42 is the top layer of the structure. In alternative embodiments, glass wavelength converting layer 42 may be attached to LED 10 and ceramic wavelength converting layer 40 may be the top layer of the structure. In some embodiments, the structure may be heated to cure adhesive 50. A bond pad 80 on mount 12 provides electrical connection for multiple LEDs 10.

In FIG. 7, a reflective material 52 is pressed into the spaces 56 between neighboring devices. Reflective material 52 is shown crosshatched in the figures to distinguish it from other layers. Reflective material 52 may be, for example, titanium oxide particles disposed in a transparent material such as silicone. Reflective material 52 between individual devices may be necessary to meet specifications for given applications, for example a light and dark contrast specification for automotive headlamps. Reflective material may be disposed over individual LEDs 10, as illustrated by reflective material 54, in addition to between neighboring devices.

In FIG. 8, reflective material 52 is thinned to remove the material over individual devices, such that light may be emitted through the top surface 55 of wavelength converting layer 42 in each device. In some embodiments, one or more bond pads 80 on mount 12, which provide electrical connection for multiple LEDs 10, are covered by reflective material 52 in FIG. 7, which is removed in FIG. 8. Excess reflective material may be removed by any suitable technique. In some embodiments, excess reflective material is removed by a dry bead blast or a wet bead blast. For example, in a dry bead blast, a stream of air and baking soda particles with an average diameter of 80 μm may be directed at the surface of the reflective material to remove the excess reflective material. In one example of a wet bead blast, plastic particles with an average diameter of 180 μm in a water slurry are directed at the surface of the reflective material to remove the excess reflective material. In some embodiments, the top surface 55 of wavelength converting layer 42 is roughened to improve light extraction during removal of excess reflective material illustrated in FIG. 8.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:
1. A method comprising:
  forming a plurality of wavelength converting elements, said forming comprising:
    forming a first wavelength converting layer, the first wavelength converting layer being a wavelength converting ceramic,
    forming a second wavelength converting layer, the second wavelength converting layer including a wavelength converting material mixed in a binder material;

fusing the second wavelength converting layer to the first wavelength converting layer to produce a composite sheet that includes the first wavelength converting layer and the second wavelength converting layer, and dicing the composite sheet to form the plurality of wavelength converting elements, the dicing being performed after the first wavelength converting layer and the second wavelength converting layer are fused; and attaching each of the wavelength converting elements to a different one of a plurality of semiconductor light emitting devices such that, for each of the wavelength converting elements, the first wavelength converting layer is disposed between the second wavelength converting layer and the semiconductor light emitting devices.

2. The method of claim 1, wherein forming the first wavelength converting layer comprises sintering a phosphor into a wafer.

3. The method of claim 1, wherein forming the second wavelength converting layer comprises:
   mixing a wavelength converting material with a glass to produce a mixture; and
   rolling the mixture into a sheet.

4. The method of claim 1, wherein:
   the binder material includes a glass;
   fusing the first wavelength converting layer to the second wavelength converting layer includes heating the first wavelength converting layer and the second wavelength converting layer to a temperature greater than a reflow temperature of the glass.

5. The method of claim 1, wherein forming the second wavelength converting layer comprises:
   mixing a wavelength converting material with a glass to produce a mixture;
   depositing the mixture on the first wavelength converting layer;
   spreading the mixture to form a substantially uniform thickness layer.

6. The method of claim 1, further comprising thinning the first wavelength converting layer prior to fusing the second wavelength converting layer to the first wavelength converting layer.

7. The method of claim 1, further comprising thinning the second wavelength converting layer after fusing the second wavelength converting layer to the first wavelength converting layer.

8. The method of claim 1, further comprising:
   attaching the plurality of semiconductor light emitting devices to a mount before each of the wavelength converting elements is attached to a different one of the plurality of semiconductor light emitting devices; and
   disposing reflective material in spaces between neighboring semiconductor light emitting devices in the plurality.

9. The method of claim 8, wherein the first wavelength converting layer and the second wavelength converting layer are configured to emit different colors of light.

10. The method of claim 1, wherein dicing the composite sheet includes forming an angled sidewall on each wavelength converting element.

11. The method of claim 1, wherein dicing the composite sheet comprises:
   forming on a first portion of each wavelength converting element a sidewall having a first angle relative to a top surface of the wavelength converting element; and
   forming on a second portion of each wavelength converting element a sidewall having a second angle relative to the top surface of the wavelength converting element, wherein the first angle is different from the second angle.

* * * * *